US012701674B2

(12) United States Patent
Gutenburg et al.

(10) Patent No.: US 12,701,674 B2
(45) Date of Patent: Aug. 4, 2026

(54) VAPOR COLUMNS WITH REDUCED CROSS-SECTIONAL AREA FOR INCREASED AIRFLOW

(71) Applicant: NVIDIA CORPORATION, Santa Clara, CA (US)

(72) Inventors: Malcolm Gutenburg, San Francisco, CA (US); Darryl Moore, Campbell, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 223 days.

(21) Appl. No.: 18/361,125

(22) Filed: Jul. 28, 2023

(65) Prior Publication Data

US 2025/0040094 A1 Jan. 30, 2025

(51) Int. Cl.
*H05K 7/20* (2006.01)
*G06F 1/20* (2006.01)

(52) U.S. Cl.
CPC ........... *H05K 7/20336* (2013.01); *G06F 1/20* (2013.01); *H05K 7/20136* (2013.01)

(58) Field of Classification Search
CPC ... H05K 7/20336; H05K 7/20136; G06F 1/20
See application file for complete search history.

(56) References Cited

U.S. PATENT DOCUMENTS

| | | | |
|---|---|---|---|
| 2002/0118511 A1* | 8/2002 | Dujari ................... | H01L 23/427 |
| | | | 174/16.3 |
| 2020/0080796 A1* | 3/2020 | Dasgupta ................. | F28F 7/02 |
| 2023/0184491 A1* | 6/2023 | Wang ................. | F28D 15/0266 |
| | | | 165/166 |

* cited by examiner

*Primary Examiner* — Mukundbhai G Patel
(74) *Attorney, Agent, or Firm* — Artegis Law Group, LLP

(57) ABSTRACT

Disclosed is a system that includes an electronic component, a fan arranged to force air in a first direction, a stacked fin assembly, and a three-dimensional vapor chamber. The three-dimensional vapor chamber includes a base that is thermally coupled to the electronic component and a plurality of vapor columns that extend outward from the base towards the stacked fin assembly. A first dimension of a first vapor column that is included in the plurality of vapor columns along the first direction is greater than a second dimension of the first vapor column along a second direction that is perpendicular to the first direction.

17 Claims, 11 Drawing Sheets

VAPOR COLUMNS WITH REDUCED CROSS-SECTIONAL AREA FOR INCREASED AIRFLOW

BACKGROUND

Field of the Various Embodiments

Embodiments of the present disclosure relate generally to cooling solutions for computing devices and, more specifically, to cooling solutions that include vapor columns with reduced cross-sectional area.

Description of the Related Art

High-performance electronic components, such as advanced central processing units and graphics processing units, generate relatively large amounts of heat during operation. This heat needs to be dissipated to prevent the components from overheating and operating at reduced levels of performance. Cooling solutions that can effectively remove heat from a system enable electronic components to operate at higher speeds and greater levels of performance. However, as the power and performance demands of processing units continue to increase, conventional cooling solutions are becoming limited by many factors, including the thermal transfer properties of the materials and geometries used to construct those cooling solutions.

One approach to cooling high-performance electronic components involves placing a heat sink and/or heat pipe in contact with a surface of the electronic component to draw heat away from the component during operation. The heat can then be dissipated by forcing air over or around the heat sink and/or heat pipe using one or more fans. The amount of heat removed from the electronic component can be increased by increasing the speed of the fans, increasing the size of the fans, and/or increasing the number of fans forcing the air over or around the heat sink and/or heat pipe. However, increasing the fan speed can cause increased acoustic noise, which can be undesirable in consumer products, such as personal computers, and spatial constraints can limit the size of the fans or the number of fans that can be used in a given computer system.

Another approach for cooling high-performance electronics components involves implementing a heat sink assembly that includes a three-dimensional (3D) vapor chamber that operates in conjunction with a stacked fin assembly and one or more fans. FIG. 1 illustrates a perspective view of a prior art 3D vapor chamber 100 that can be implemented as part of a conventional heat sink assembly. As shown, the 3D vapor chamber 100 includes a vapor chamber base 105 that contacts the electronic component (e.g., processing unit) being cooled and multiple cylindrical vapor columns 110 that are attached to and extend outward from the base 105 to direct heat towards and through a stacked fin assembly 115 that is attached to the 3D vapor chamber 100. As shown in FIG. 2 and FIG. 3, which illustrate top-down and cross-section views, respectively, of the 3D vapor chamber 100 of FIG. 1, the cylindrical vapor columns 110 extend through the stacked fin assembly 115. One or more fans (not shown) are used to force air across the base 105 of the 3D vapor chamber 100 and through the stacked fin assembly 115, thereby further cooling the electronic component. As further shown in FIG. 2, the cylindrical vapor columns 110 are circular such that the width (e.g., diameter) of a cylindrical vapor column 110 in the x-direction is equal to the length (e.g., diameter) of the cylindrical vapor column 110 in the z-direction.

Because the cylindrical vapor columns 110 extend outward from the base 105 of the 3D vapor chamber, the air being forced across the base 105 of the 3D vapor chamber 100 by the one or more fans is impeded by and forced to flow around the cylindrical vapor columns 110. That is, each respective cylindrical vapor column 110 included the 3D vapor chamber 100 impedes the flow of air being forced across the base 105 such that the forced air flows around the cylindrical vapor columns 110 and through channels formed between adjacent cylindrical vapor columns 110. This impedance causes a pressure drop across the base 105 of the 3D vapor chamber 100 in the direction of the air flow, which has the effect of reducing the amount of heat that the forced air can dissipate and remove from the electronic component. Although increasing fan speed, increasing the size of the fans, and/or increasing the number of fans to force more air across the heat sink assembly would improve overall heat dissipation and cooling, as described above, these approaches can increase acoustic noise in an undesirable fashion or cannot be effectively implemented due to spatial constraints in a given computer system.

As the foregoing illustrates, what is needed in the art are more effective techniques for removing heat from electronic components during operation.

SUMMARY

One embodiment of the present disclosure sets forth a system that includes an electronic component, a fan arranged to force air in a first direction, a stacked fin assembly, and a three-dimensional vapor chamber. The three-dimensional vapor chamber includes a base that is thermally coupled to the electronic component and a plurality of vapor columns that extend outward from the base towards the stacked fin assembly. A first dimension of a first vapor column that is included in the plurality of vapor columns along the first direction is greater than a second dimension of the first vapor column along a second direction that is perpendicular to the first direction.

At least one technical advantage of the disclosed design relative to the prior art is that, in the disclosed design, the pressure drop across a 3D vapor chamber within a cooling system can be reduced without increasing fan speed, fan size, or the number of fans forcing air through the vapor chamber. In this regard, the vapor columns included in the disclosed design are configured such that the cross-sectional area of each vapor column is reduced in a direction that is perpendicular to airflow across the base of the 3D vapor chamber. By reducing the cross-sectional area of each vapor column in the direction of airflow across the 3D vapor chamber base, the overall impedance generated by the vapor columns and experienced by the air flowing through the 3D vapor chamber is reduced relative to prior art designs. The reduction in impedance results in a reduced pressure drop across the 3D vapor chamber relative to the pressure drops experienced in prior art designs. Thus, with the disclosed design, the amount of heat that can be dissipated by the cooling system can be increased without increasing fan speed, fan size, or the number of fans implemented as part of the cooling system. These technical advantages provide one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one of skilled in the art that the inventive concepts may be practiced without one or more of these specific details.

Figure 1:
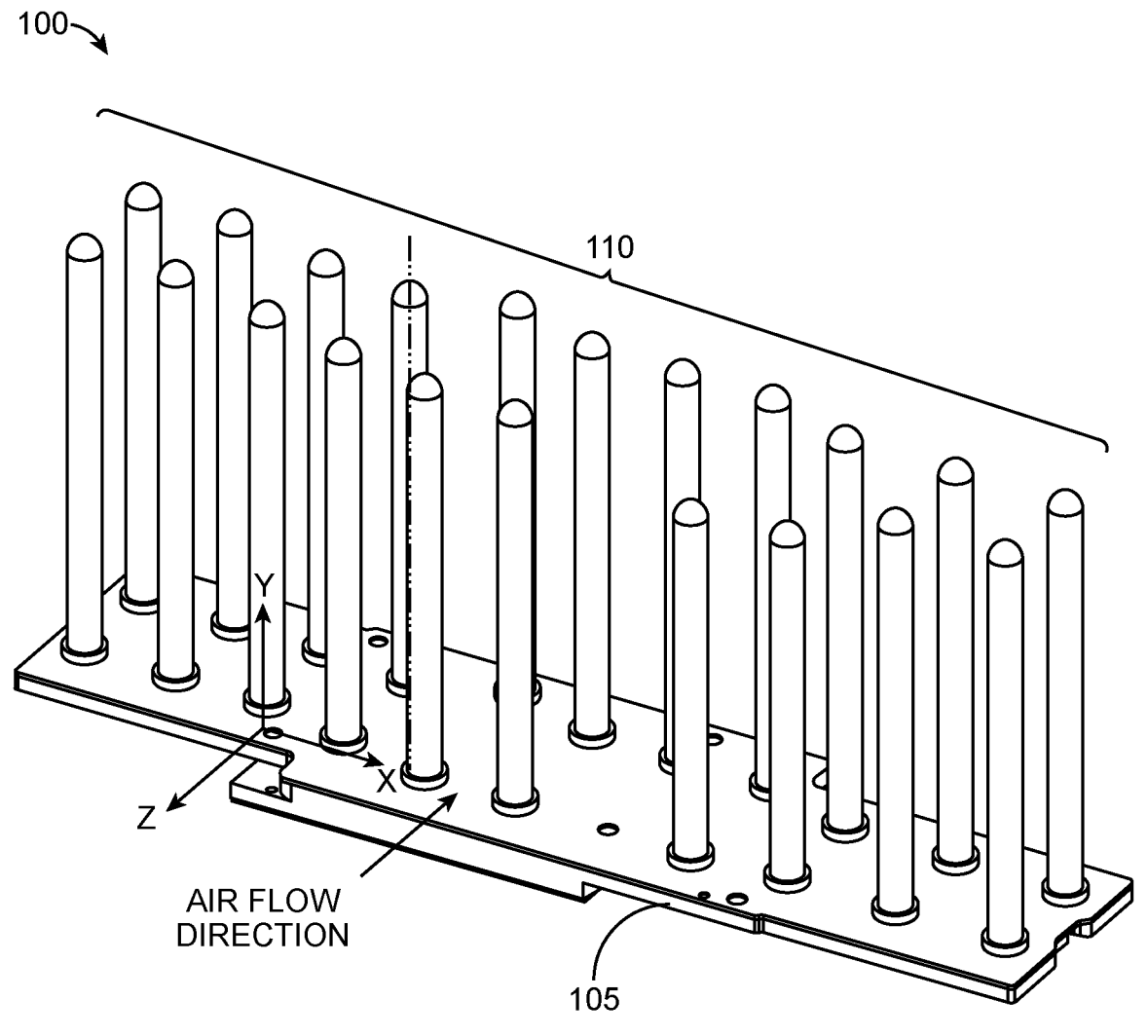
FIG. 1 illustrates a perspective view of a three-dimensional (3D) vapor chamber implemented in a conventional cooling system, according to the prior art.
Figure 2:
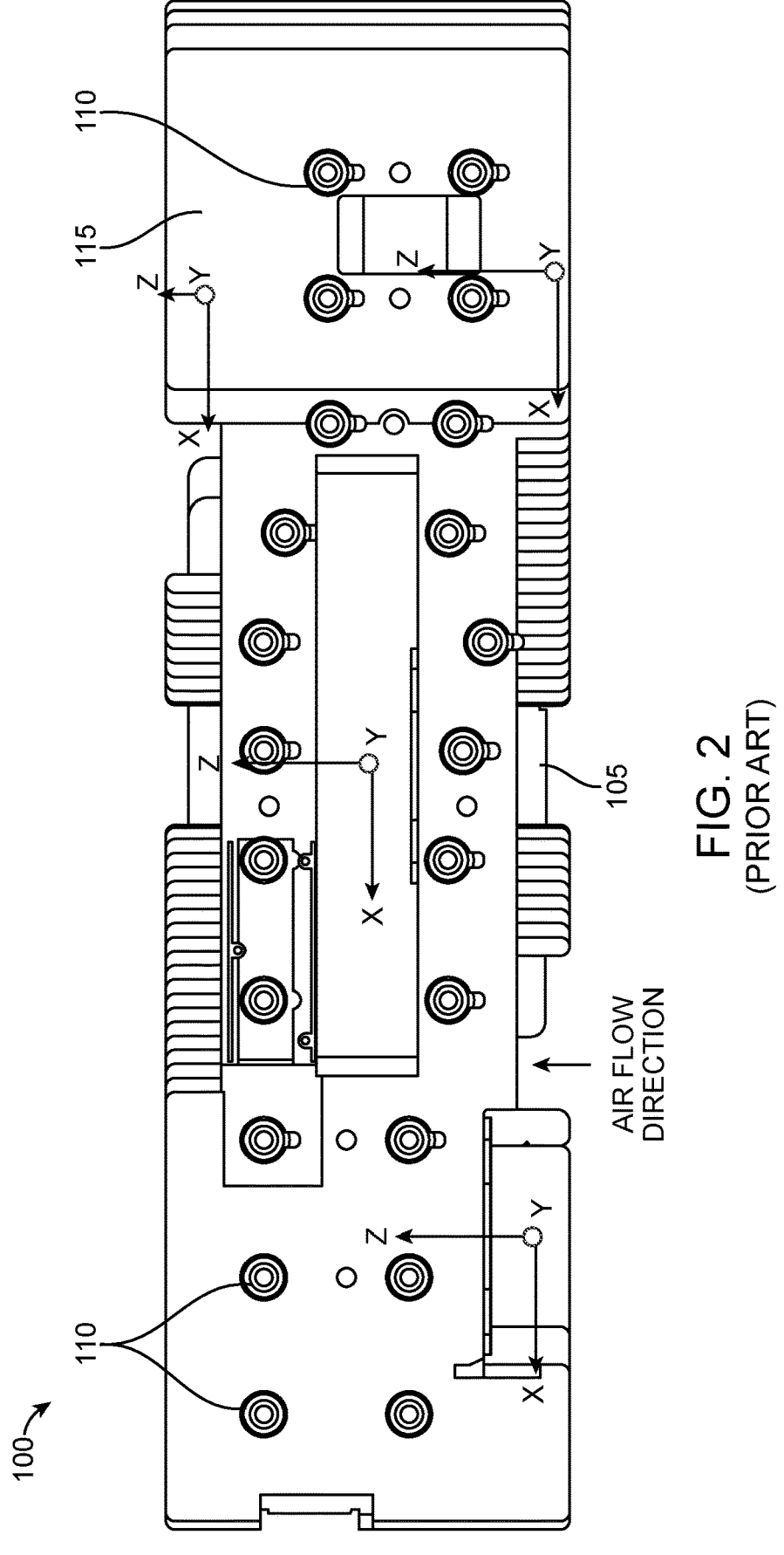
FIG. 2 illustrates a top-down view of the 3D vapor chamber of FIG. 1.
Figure 3:
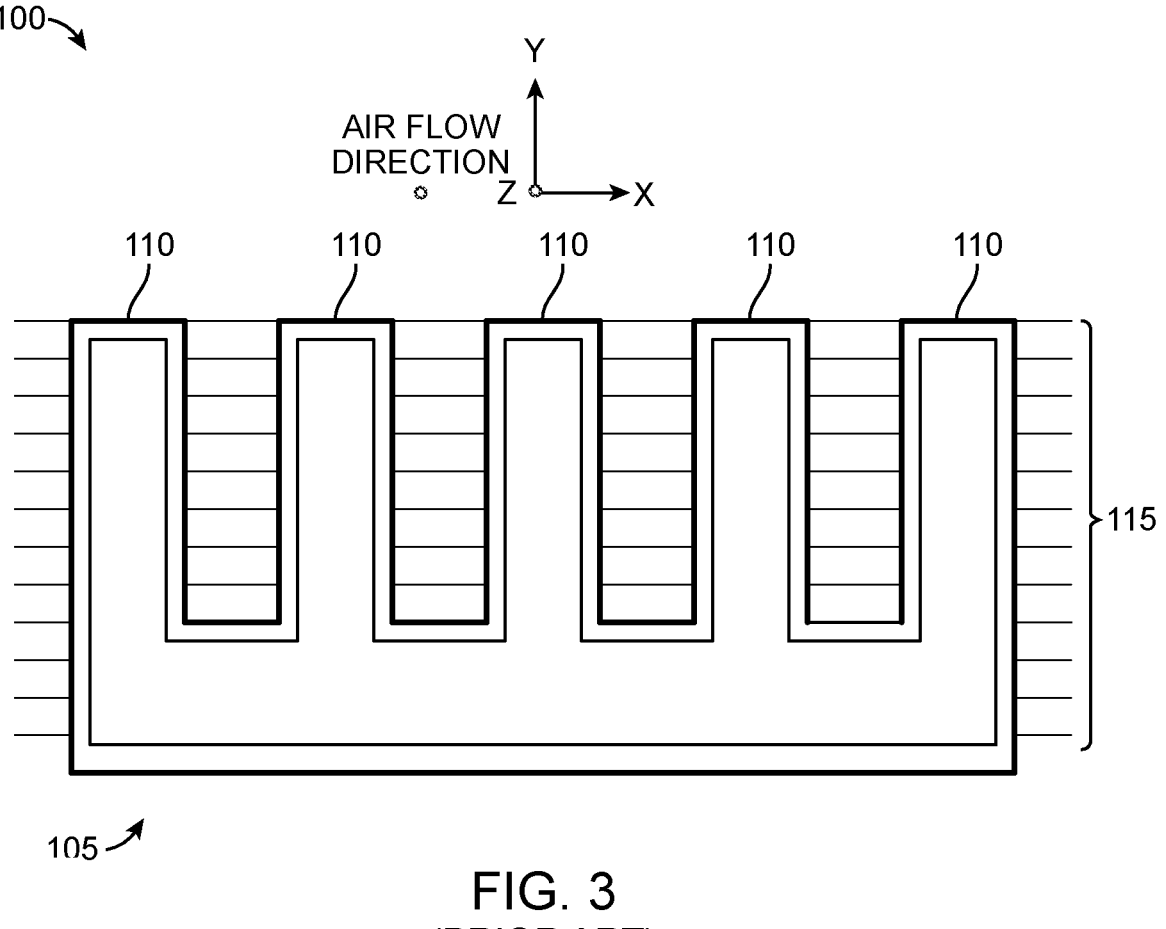
FIG. 3 illustrates a cross-section view of the 3D vapor chamber of FIG. 1.
Figure 4:
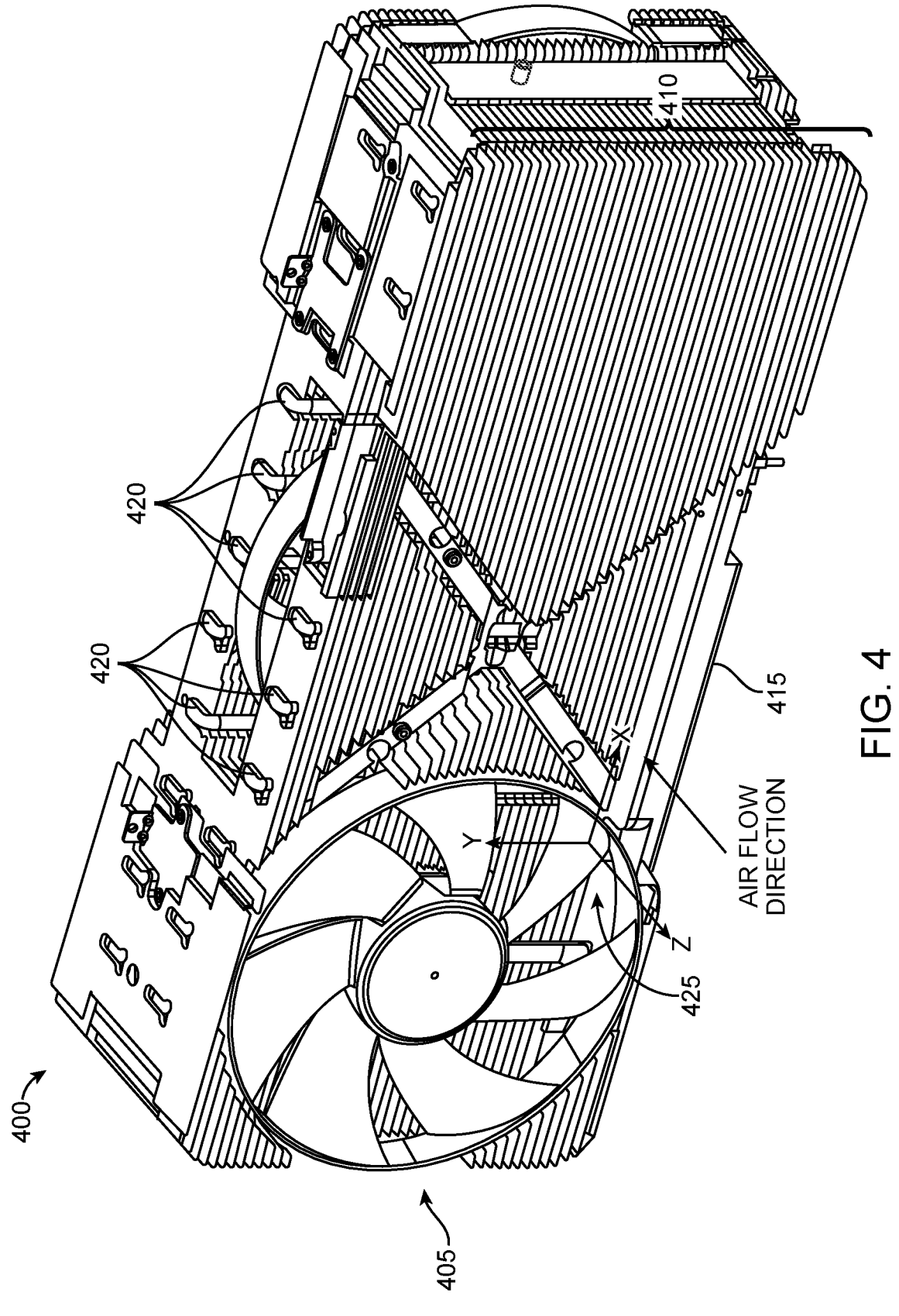
FIG. 4 illustrates a perspective view of a cooling system, according to various embodiments.

FIG. 4 illustrates a perspective view of a cooling system 400, according to various embodiments. The cooling system 400 is described herein as being used for cooling an electronic component, such as a processing unit or other type of electronic component and/or device that generates heat during operation and needs to be cooled. In some examples, the cooling system 400 can be implemented in a computer system to cool one or more electronic components included in the computer system. As persons skilled in the art will appreciate, a computer system that includes and/or implements the cooling system 400 can be any type of technically feasible computer system, including, without limitation, a server machine, a server platform, a desktop machine, laptop machine, a hand-held/mobile device, or a wearable device. Moreover, when implemented and/or included in a computer system, the cooling system 400 can be used to cool one or more electronic components, such as a central processing unit (CPU), a graphics processing unit (GPU), a parallel processing unit, a switching device, a memory unit, a storage unit, and/or some other electronic component or device, included in the computer system. Furthermore, persons skilled in the art will understand that the cooling system 400 can also be used to cool other types of components or objects that generate heat during operation. For example, the cooling system 400 can be implemented in and/or otherwise used to cool components other than electronic components included in computer systems and/or computing devices.

As shown in FIG. 4, the cooling system 400 includes a fan 405, a stacked fin assembly 410, and a three-dimensional (3D) vapor chamber 600. The stacked fin assembly 410 is a type of heat sink that includes a plurality of thermally conductive plates, or fins, spaced apart by air gaps. The 3D vapor chamber 600 includes a vapor chamber base 415 that contacts the electronic component 605 being cooled and a plurality of vapor columns 420 that are attached to and extend outward from the vapor chamber base 415. As shown, the plurality of vapor columns 420 extend through through respective openings formed in the stacked fin assembly 410, which is separate from and attached to the 3D vapor chamber 600. When attached to the 3D vapor chamber 600, the stacked fin assembly 410 is in thermal contact with the plurality of vapor columns 420. In some instances, the stacked fin assembly 410 and the 3D vapor chamber 600 can collectively be referred to as a heat sink assembly.

Figure 5:
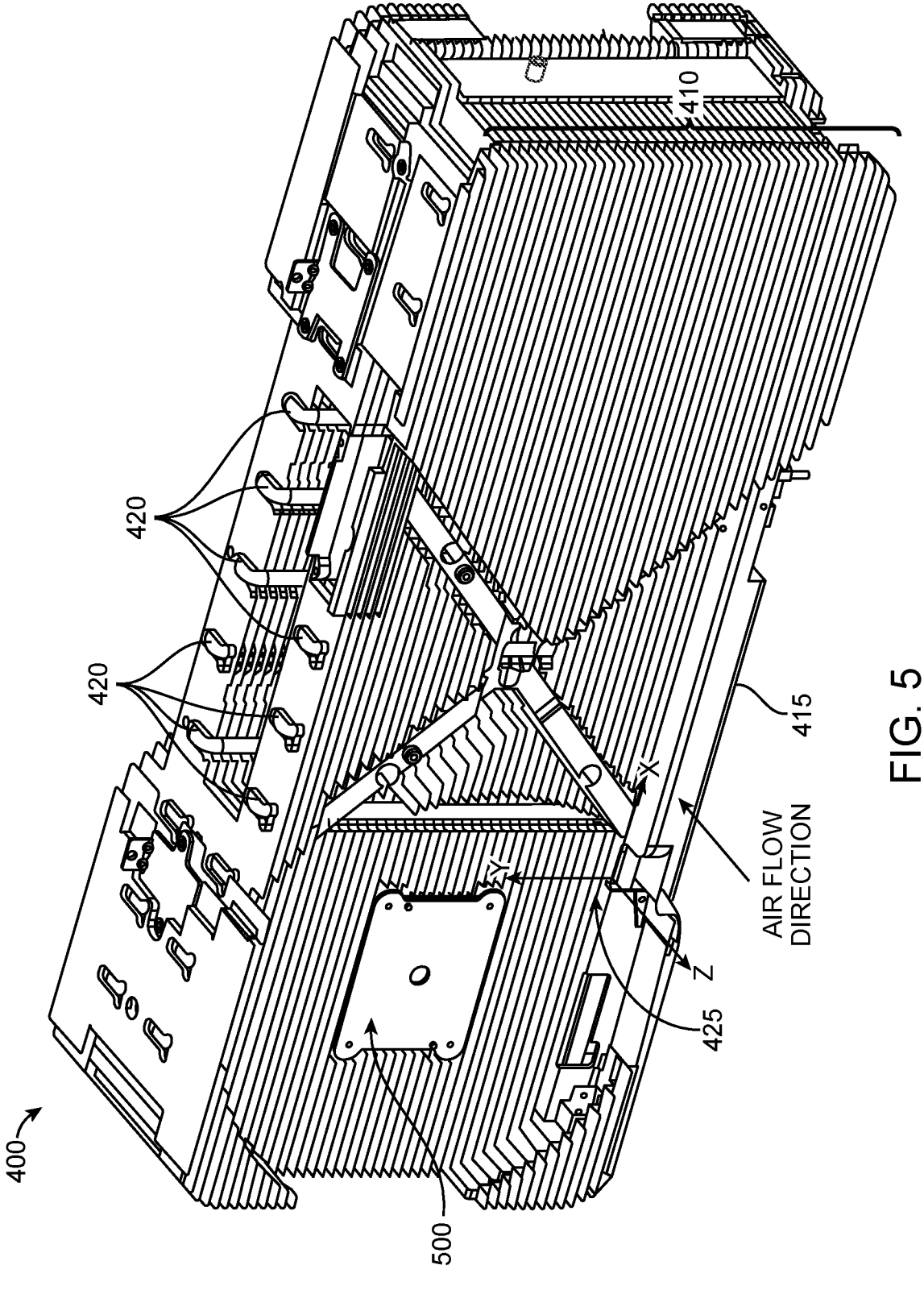
FIG. 5 illustrates a perspective view of the cooling system of FIG. 4, according to various embodiments.

As shown in FIG. 5, which illustrates a perspective view of the cooling system 400 in which the fan 405 is removed, a fan mount 500 is used to attach the fan 405 to the stacked fin assembly 410. However, persons skilled in the art will understand that in some embodiments, the fan 405 is attach to the cooling system 400 in a different arrangement. Furthermore, although the cooling system 400 is shown as including a single fan 405, in some embodiments, the cooling system 400 includes more than one fan. For example, in some embodiments, the cooling system 400 includes two or more fans. In some embodiments, the cooling system 400 does not include a fan 405 that is attached directly to the stacked fin assembly 410. In such embodiments, the cooling system 400 includes one or more external fans and/or air movers that are external to the stacked fin assembly 410. Further, in such embodiments, the stacked fin assembly 410 and/or the 3D vapor chamber 600 are positioned in the path of air forced by the one or more external fans and/or air movers.

In operation, the stacked fin assembly 410 and the 3D vapor chamber 600 work to dissipate heat away from the electronic component 605 being cooled. In addition, the fan 405 forces air over the vapor chamber base 415 to further remove heat from the electronic component 605 via convection. With respect to the coordinate axes 425 shown in FIGS. 4-6 and FIGS. 8-9, the direction in which the fan 405 forces air over the vapor chamber base 415 is the z-direction. As will be described in more detail below, air forced in the z-direction by the fan 405 flows between the fins included in the stacked fin assembly 410 and around the vapor columns 420 that extend through the stacked fin assembly 410.

Figure 6:
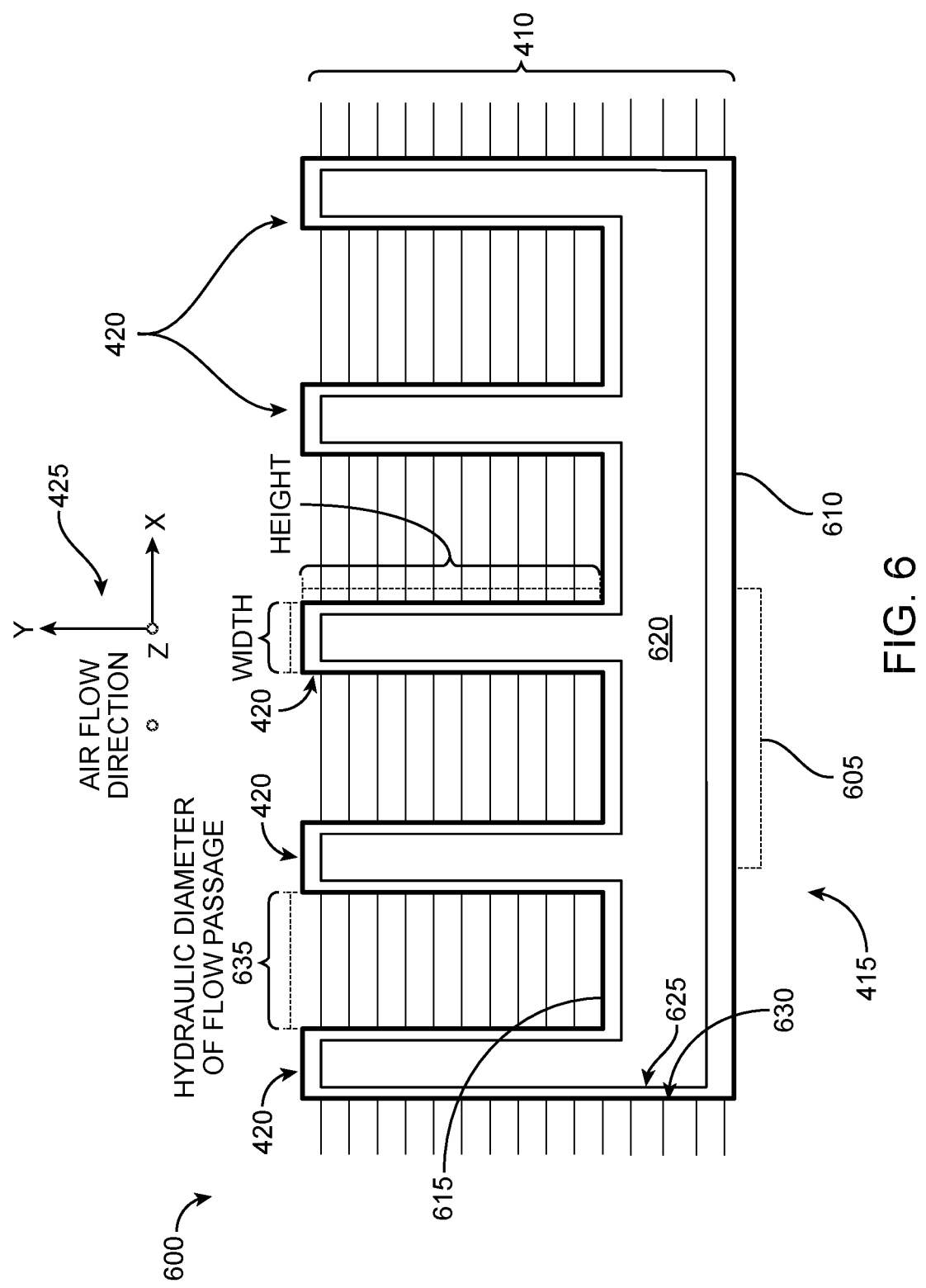
FIG. 6 illustrates a cross-section view of a 3D vapor chamber implemented in the cooling system of FIG. 4, according to various embodiments.

FIG. 6 illustrates a cross-section view of the 3D vapor chamber 600 included in the cooling system 400, according to various embodiments. For illustrative purposes, the stacked fin assembly 410 attached to the 3D vapor chamber 600 is also illustrated in the cross-section view of 3D vapor chamber 600. With respect to the coordinate axes 425, the cross-section view of the 3D vapor chamber 600 is taken along the x-y plane and is perpendicular to the z-direction in which the fan 405 forces air over the vapor chamber base 415. As shown, the vapor chamber base 415 includes a bottom surface 610 and a top surface 615. The bottom surface 610 of the vapor chamber base 415 is arranged to contact the electronic component 605 being cooled by the cooling system 400.

The vapor columns 420 are attached to and extend outward from the top surface 615 of the vapor chamber base 415 such that the respective interior spaces of the vapor columns 420 open into the interior space of the vapor chamber base 415. This combined interior space of the vapor chamber base 415 and the vapor columns 420 can be referred to as the vapor space 620 of the 3D vapor chamber 600. A wick material 625 is disposed between the vapor space 620 and the enclosure 630 of the 3D vapor chamber 600. The enclosure 630 of the 3D vapor chamber 600, which can be formed of a thermally conductive material such as copper, forms the exterior of the vapor chamber base 415 and the vapor columns 420. The wick material 625, which lines the inner surface of the enclosure 630, can be implemented as one or more of a sintered wick, a grooved wick, a mesh/bundled fiber wick, or some other type of wick.

During operation of the cooling system 400, heat dissipated by the electronic component 605 is input, or introduced, into the 3D vapor chamber 600 via conduction through the bottom surface 610 of the vapor chamber base 415. This introduction of heat into the 3D vapor chamber 600 causes a liquid carried by the wick material 625 to vaporize and spread throughout the vapor space 620 away from the electronic component 605. As the vapor spreads throughout the vapor space 620, for example throughout the interior of the vapor chamber base 415 and/or the interiors of the vapor columns 420, the vapor condenses on the fins of the stacked fin assembly 410. Heat is then removed from the condensate formed on the fins of the stacked fin assembly 410 by the fan 405, which forces air over the vapor chamber base 415 and through the stacked fin assembly 410 in the z-direction. Capillary forces in the wick material 625 then return the condensate formed on fins of the stacked fin assembly 410 and the cooling process is repeated.

As described above, air forced over the vapor chamber base 415 and through the stacked fin assembly 410 by the fan 405 helps remove heat from the stacked fin assembly 410. However, as the forced air flows through the stacked fin assembly 410, air flow is impeded by the vapor columns 420 that protrude through the stacked fin assembly 410. For example, with respect to the coordinate axes 425, the vapor columns 420 extend in the x and y directions thereby blocking air flow forced by the fan 405 in the z-direction, which is perpendicular to the x and y directions. The dimension of a vapor column 420 that extends in the x-direction (e.g., along the x-axis) can be referred to as the width of the vapor column 420 and the dimension of a vapor column 420 that extends in y-direction (e.g., along the y-axis) can be referred to as the height of the vapor column 420.

When air forced over the vapor chamber base 415 in the z-direction by the fan 405 is impeded by a vapor column 420, the air is redirected to flow through flow passages 635 formed between adjacent vapor columns 420. However, as described above with respect to the prior art 3D vapor chamber 100, when the vapor columns 420 impede the flow of air in the z-direction such that the air is forced to flow through flow passages 635 formed between adjacent vapor columns 420, a drop in air pressure over the vapor chamber base 415 occurs in the z-direction. As the drop in air pressure across the vapor chamber base 415 increases, the amount of heat that can be dissipated via convection by air forced by the fan 405 decreases.

Although increasing the speed of the fan 405, increasing the size of the fan 405, and/or increasing the number of fans 405 to force more air across the heat sink assembly would improve overall heat dissipation and cooling, as described above, these approaches can increase acoustic noise in an undesirable fashion or cannot be effectively implemented due to spatial constraints in a given computer system. Accordingly, to increase the amount of heat that can be dissipated by the cooling system 400 via convection, the 3D vapor chamber 600 is designed to reduce the drop in air pressure over the vapor chamber base 415 in the z-direction.

The drop in air pressure across the vapor chamber base 415 in the z-direction can be determined using the Darcy-Weisbach Equation, which is expressed below as Equation 1:

$$\Delta P = \frac{fLv^2\rho}{2D_H} \tag{1}$$

Where $\Delta P$ is the drop in air pressure across the vapor chamber base 415 in the z-direction, f is the airflow coefficient, L is the length of the flow passage 635 through which air is forced, v is the velocity of airflow through the flow passage 635, p is the density of air, and $D_H$ is the hydraulic diameter of the flow passage 635. With respect to the coordinate axes 425, the hydraulic diameter (e.g., width) of a flow passage 635 formed between adjacent vapor columns 420 is equal to the distance in the x-direction (e.g., along the x-axis) between the adjacent vapor columns 420.

As expressed above in Equation 1, the drop in air pressure across the vapor chamber base 415 in the z-direction is inversely proportional to the hydraulic diameter of a flow passage 635 formed between adjacent vapor columns 420. Accordingly, the drop in air pressure across the vapor chamber base 415 in the z-direction can be reduced by increasing the hydraulic diameter of the flow passages 635 formed between adjacent vapor columns 420. A similar conclusion regarding this relationship between the hydraulic diameter of a flow passage 635 and a reduction in the drop of air pressure across the vapor chamber base 415 can be reached when the cooling system 400 is modeled as a thermal resistance circuit.

Figure 7:
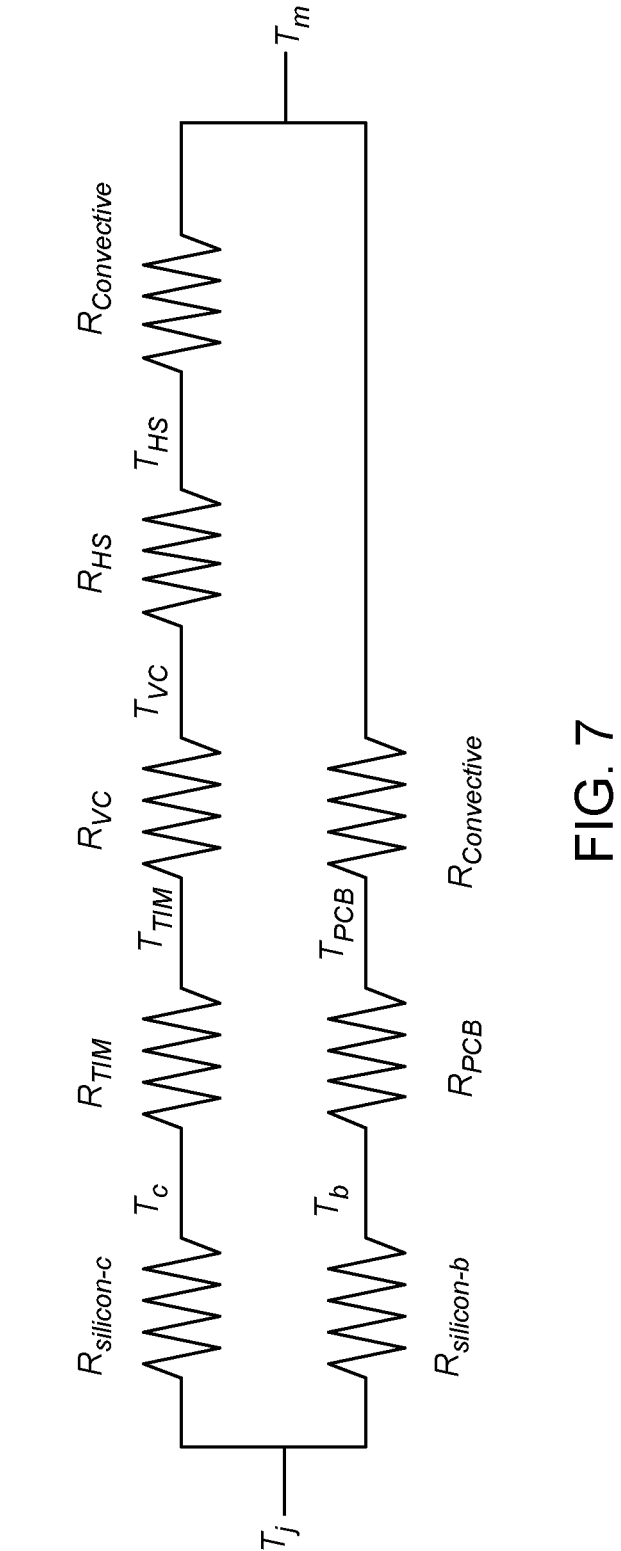
FIG. 7 illustrates a thermal resistance circuit for the cooling system of FIG. 4, according to various embodiments

FIG. 7 illustrates a thermal resistance circuit 700 for the cooling system 400. As shown, the thermal resistance circuit 700 includes the equivalent thermal resistances of components included in the cooling system 400. For example, the thermal resistance circuit 700 includes the equivalent thermal resistance $R_{silicon-b}$ of the base, or bottom, of the electronic component 605 (e.g., a silicon chip) being cooled, the equivalent thermal resistance $R_{silicon-c}$ of the case, or top, of the electronic component 605 being cooled, the equivalent thermal resistance $R_{TIM}$ of the thermal interface between the the electronic component 605 being cooled and the 3D vapor chamber 600, the equivalent thermal resistance $R_{VC}$ of the 3D vapor chamber 600, the equivalent thermal resistance $R_{HS}$ of the stacked fin assembly 410, and the equivalent thermal resistance $R_{Convective}$ of the air forced over the vapor chamber base 415 by the fan 405 to remove heat from the stacked fin assembly 410.

In addition, the thermal resistance circuit 700 indicates the respective temperatures of components included in the cooling system 400. For example, the temperature $T_b$ is indicative of the temperature of the bottom of the electronic component 605 being cooled, the input temperature $T_j$ of the thermal resistance circuit 700 is indicative of the temperature of the electronic component 605 being cooled, the temperature Tc is indicative of the temperature of the top of the electronic component 605 being cooled, the temperature $T_{TIM}$ is indicative of the temperature of thermal interface between the silicon coating of the electronic component 605 being cooled and the 3D vapor chamber 600, the temperature $T_{VC}$ is indicative of the temperature of the 3D vapor chamber 600, the temperature $T_{HS}$ is indicative of the temperature of the stacked fin assembly 410, and the output temperature $T_\infty$ is indicative of the temperature of the air forced over the vapor chamber base 415 and through the stacked fin assembly 410 by the fan 405 to remove heat from the stacked fin assembly 410.

The amount of heat that air forced over the vapor chamber base 415 removes from the stacked fin assembly 410 via convection can be determined using Equation 2 below.

$$Q_{Convective} = \frac{T_{HS} - T_\infty}{R_{Convective}} \qquad (2)$$

Where $Q_{Convective}$ is the amount of heat removed from the stacked fin assembly 410 by air forced over the vapor chamber base 415 in the z-direction by the fan 405, $R_{Convective}$ is the equivalent thermal resistance of air forced over the vapor chamber base 415 in the z-direction by the fan 405, $T_{HS}$ is the temperature of the stacked fin assembly 410, and $T_\infty$ is the temperature of the air forced over the vapor chamber base 415 in the z-direction by the fan 405.

As expressed below by Equation 3, the equivalent thermal resistance $R_{Convective}$ of air forced over the vapor chamber base 415 in the z-direction by the fan 405 is inversely proportional to the mass flow rate of the air forced over the vapor chamber base 415 in the z-direction by the fan 405.

$$R_{Convective} = \frac{1}{mC_p} \qquad (3)$$

Where m is the mass flow rate of air forced over the vapor chamber base 415 in the z-direction by the fan 405 and $C_p$ is the specific heat capacity of air. Using Equation 4 below, the mass flow rate of air forced over the vapor chamber base 415 in the z-direction by the fan 405 can be expressed as a function of the velocity of the forced air as it flows through a flow passage 635 formed between adjacent vapor columns 420, the cross-sectional area of the flow passage 635, and the density of air.

$$m = \rho v A \qquad (4)$$

Where m is the mass flow rate of air flowing through a flow passage 635, $\rho$ is the density of air, v is the velocity of air flowing through the flow passage 635, and A is the cross-sectional area of the flow passage 635.

When Equations 2-4 are combined into Equation 5, which is expressed below, it becomes apparent that the amount of heat removed from the stacked fin assembly 410 by air forced over the vapor chamber base 415 in the z-direction by the fan 405 is proportional to the cross-sectional area of the flow passage 635. That is, the amount of heat removed from the stacked fin assembly 410 by air forced over the vapor chamber base 415 in the z-direction by the fan 405 increases when the cross-sectional area of the flow passage 635 increases.

$$Q_{Convective} = \rho v A C_p (T_{HS} - T_\infty) \qquad (5)$$

Where $Q_{Convective}$ is the amount of heat removed from the stacked fin assembly 410 by air forced over the vapor chamber base 415 in the z-direction by the fan 405, $\rho$ is the density of air, v is the velocity of air flowing through the flow passage 635, and A is the cross-sectional area of the flow passage 635, $C_p$ is the specific heat capacity of air, $T_{HS}$ is the temperature of the stacked fin assembly 410, and $T_\infty$ is the temperature of the air forced over the vapor chamber base 415 in the z-direction by the fan 405.

As described above with respect to Equations 1-5, increasing the hydraulic diameter of a flow passage 635 formed between adjacent vapor columns 420 and/or the cross-section area of a flow passage 635 formed between adjacent vapor columns 420 reduces the drop in air pressure over the vapor chamber base 415 in the z-direction and increases the amount of heat that air forced over the vapor chamber base 415 in the z-direction by the fan 405 removes from the stacked fin assembly 410. Since the hydraulic diameter of a flow passage 635 formed between adjacent vapor columns 420 is equal to the distance in the x-direction between the adjacent vapor columns 420, the hydraulic diameter of a flow passage 635 formed between adjacent vapor columns 420 is inversely proportional to the respective widths of the adjacent vapor columns 420. For example, when the respective widths of adjacent vapor columns 420 are increased (e.g., the vapor columns 420 are extended in the x-direction), the hydraulic diameter of the flow passage 635 formed between the adjacent vapor columns 420 decreases. Conversely, when the respective widths of the adjacent vapor columns 420 are decreased (e.g., the vapor columns 420 are reduced in size in the x-direction), the hydraulic diameter of the flow passage 635 formed between the adjacent vapor columns 420 increases. Therefore, the hydraulic diameter of a flow passage 635 formed between adjacent vapor columns 420 can be increased by decreasing the widths of the adjacent vapor columns 420. In some embodiments, the hydraulic diameter of a flow passage 635 formed between adjacent vapor columns 420 is designed to be greater than the respective widths of the adjacent vapor columns 420.

However, simply decreasing the width of a vapor column 420 can cause the performance level of the vapor column 420 to decrease if the volume of the vapor space 620 and/or the wick material 625 within the vapor column 420 is also decreased. For example, as the volume of the vapor space 620 within an interior of a vapor column 420 and/or an amount of wick material 625 in a vapor column 420 is reduced, the vapor column 420 becomes less efficient at spreading heat away from the electronic component 605. Thus, to prevent a decrease in performance caused by reducing the inner-volume of a vapor column 420, the vapor columns 420 included the 3D vapor chamber 600 are designed such that a width of a vapor column 420 is reduced while the length of the vapor column 420 is increased. In some embodiments, the length of each vapor column 420 included in the 3D vapor chamber 600 is greater than the width of each vapor column 420 included the 3D vapor chamber 600. In some embodiments, only some of the vapor columns 420 included in the 3D vapor chamber 600 have lengths that are greater than their widths.

Figure 8:
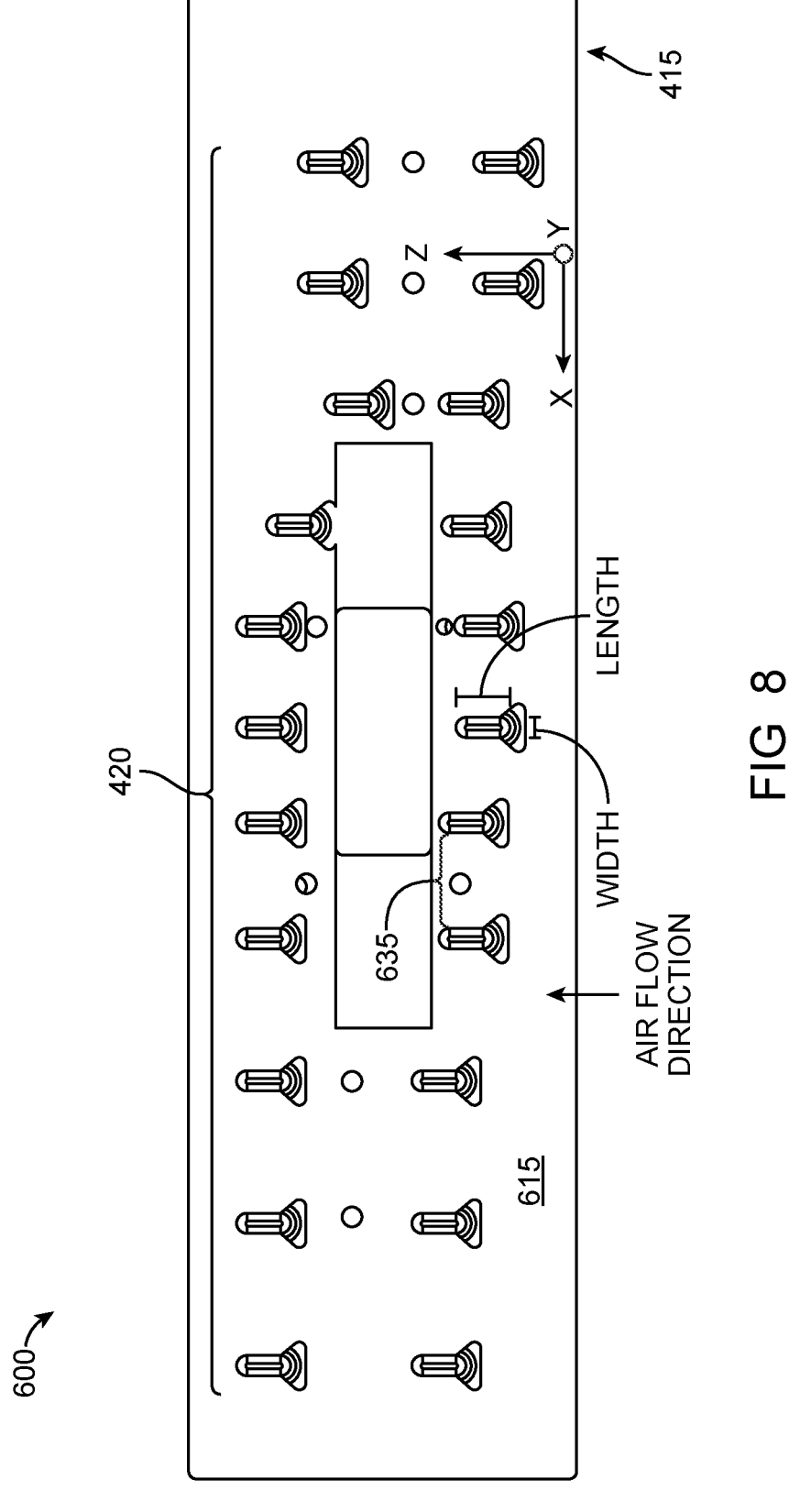
FIG. 8 illustrates a top-down view of the 3D vapor chamber of FIG. 6, according to various embodiments.

FIG. 8 illustrates a top-down view of the 3D vapor chamber 600 in which the stacked fin assembly 410 is removed, according to various embodiments. With respect to the coordinate axes 425, the length of a vapor column 420 is the dimension of the vapor column that extends in the z-direction (e.g., along the z-axis). As shown in FIG. 8, the length of each vapor column 420 is greater than the width of each vapor column 420. In the illustrated example of FIG. 8, the length of each vapor column 420 is approximately 10.66 mm and the width of each vapor column 420 is approximately 4 mm. Accordingly, the length of each vapor column 420 is approximately 265% greater than the width of each vapor column 420. Persons skilled in the art will understand that a 10.66 mm length and a 4 mm width are just two non-limiting examples of the dimensions of a vapor column 420. Moreover, persons skilled in the art will understand that the vapor columns 420 can be designed with length-to-width ratios that are different than the length-to-width ratio illustrated in the example of FIG. 8.

In some embodiments, the length of a vapor column 420 is more than 265% greater than the width of the vapor column 420. For example, in some embodiments, the length of a vapor column 420 is 300% greater, 350% greater, 400% greater, or some other percentage amount greater than the width of the vapor column 420. In some embodiments, the percentage amount by which the length of a vapor column 420 is greater than the width of the vapor column 420 is less than 265%. For example, in some embodiments, the length of a vapor column 420 is 250% greater, 200% greater, 150% greater, or some other percentage amount greater than the width of the vapor column 420. In some embodiments, the length of the vapor column 420 is designed to be at least a minimum percentage amount (e.g., 100%, 150%, 200%, etc.) greater than the width of the vapor column 420.

Since the length of a vapor column 420 is the dimension of the vapor column 420 that extends in the z-direction (e.g., along the z-axis), the length of the vapor column 420 is the dimension of the vapor column 420 that is parallel to the direction (e.g., the z-direction) in which the fan 405 forces air over the vapor chamber base 415 to cool the stacked fin assembly 410. Therefore, increasing the length of a vapor column 420 in the z-direction does not impede the flow of forced air as it flows through a flow passage 635. Accordingly, by reducing the width of the vapor columns 420 in the x-direction and increasing the lengths of the vapor columns 420 in the z-direction, the 3D vapor chamber 600 experiences the above-described benefits of flow passages 635 with increased hydraulic diameters without negatively impacting the heat spreading capabilities of the vapor columns 420.

Figure 9:
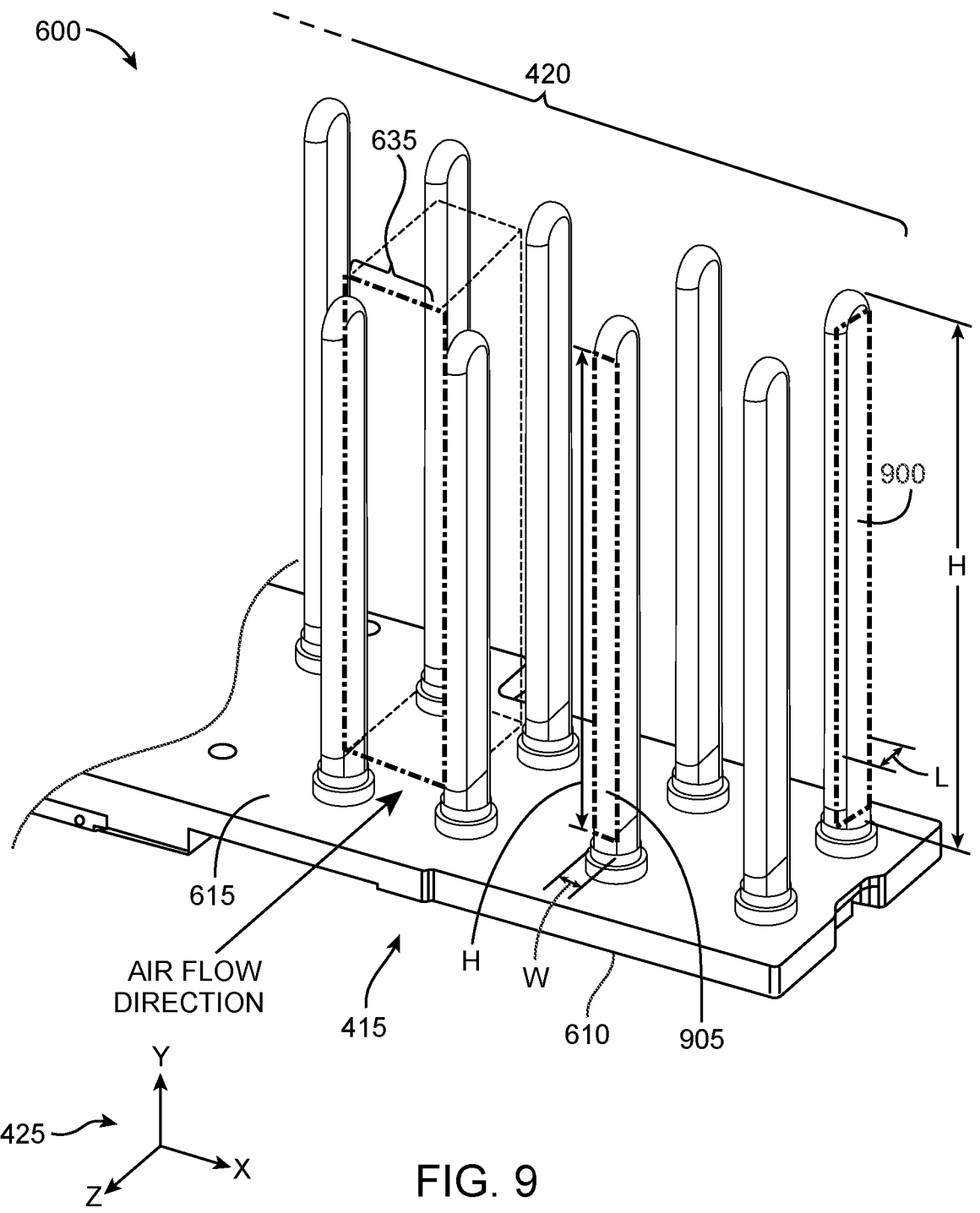
FIG. 9 illustrates a perspective view of a portion of the 3D vapor chamber of FIG. 6, according to various embodiments.

FIG. 9 illustrates a perspective view of a portion of the 3D vapor chamber 600 in which the stacked fin assembly 410 is removed, according to various embodiments. In FIG. 9, an outline of a flow passage 635 and first and second cross-sectional areas 900, 905 of the vapor columns 420 are illustrated. Although the first cross-sectional area 900 is illustrated with respect to only one of the vapor columns 420, persons skilled in the art will understand that the description of the first cross-sectional area 900 is equally applicable to the other vapor columns 420 illustrated in FIG. 9. Similarly, although the second cross-sectional area 905 is illustrated with respect to only one of the vapor columns 420, persons skilled in the art will understand that the description of the second cross-sectional area 905 is equally applicable to the other vapor columns 420 illustrated in FIG. 9.

With respect to the coordinate axes 425, the first cross-sectional area 900 is parallel to the y-z plane. Accordingly, the first cross-sectional area 900 is parallel to the direction (e.g., z-direction) in which the fan 405 forces air over the vapor chamber base 415. Moreover, the first cross-sectional area 900 is representative of a size of the portion of the vapor column 420 that does not impede the flow of air forced over the vapor chamber base 415 by the fan 405. The value of the first cross-sectional area 900 is equal to the product of the length of the vapor column 420 and the height of the vapor column 420. The second cross-sectional area 905 is parallel to the x-y plane. Accordingly, the second cross-sectional area 905 is perpendicular to the direction (e.g., z-direction) in which the fan 405 forces air over the vapor chamber base 415. Thus, the second cross-sectional area 905 is representative of the portion of the vapor column 420 that impedes the flow of air forced over the vapor chamber base 415 by the fan 405. The value of the second cross-sectional area 905 is equal to the product of the width of the vapor column 420 and the height of the vapor column 420.

Since the length of a vapor column 420 is greater than the width of the vapor column 420, the value of the first cross-sectional area 900 of a vapor column 420 is greater than the value of the second cross-sectional area 905 of the vapor column 420. Therefore, the cross-sectional area of the vapor column 420 that is parallel to the direction in which the fan 405 forces air over the vapor chamber base 415 is greater than the cross-sectional area of the vapor column that is perpendicular to the direction in which the fan 405 forces air over the vapor chamber 415. In other words, the cross-sectional area of the vapor column 420 that impedes the flow of air forced over the vapor chamber base 415 by the fan 405 (e.g., second cross-sectional area 905) is reduced relative to the cross-sectional area of the vapor column 420 that does not impede the flow of air forced over the vapor chamber base 415 by the fan 405 (e.g., first cross-sectional area 900).

Figures 10A, 10B, 10C:
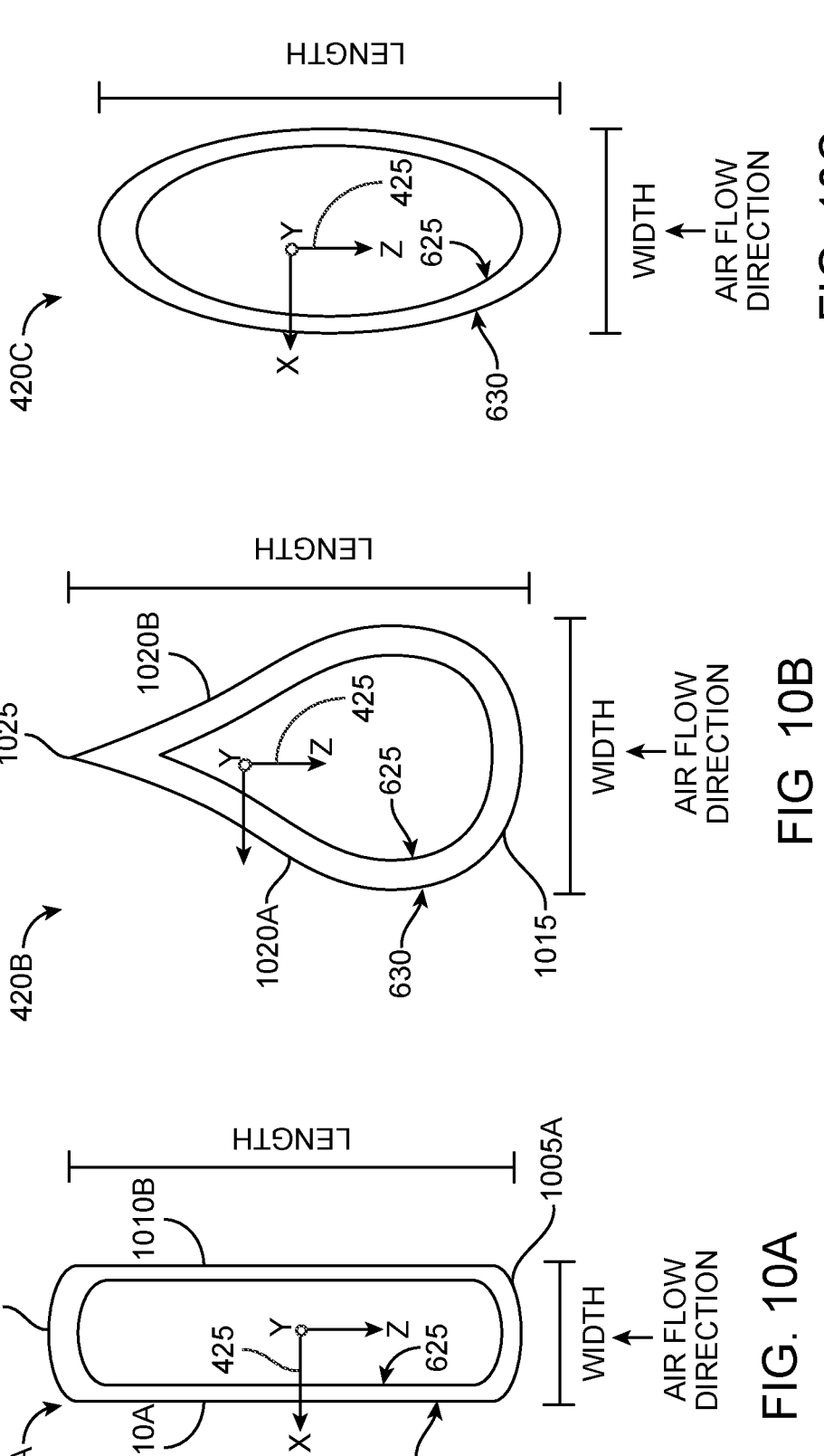
FIGS. 10A-10C illustrate top-down views of different exemplar vapor column cross sections, according to various embodiments.

The vapor columns 420 are illustrated in FIGS. 6, 8, and 9 as having a generally flattened, rectangular shape. For example, the vapor columns 420 are shaped like rectangular prisms that have rounded edge surfaces. FIG. 10A illustrates a top-down view of a cross-section of a vapor column 420A that is implemented as a rectangular prism with rounded, or curved, edge surfaces. As shown, the cross-section of the vapor column 420A is generally rectangular in shape, and thus, the base of the vapor column 420A is generally rectangular in shape. However, the edge surfaces 1005A, 1005B of the vapor column 420A that extend in the x-direction have a convex curvature relative to the interior of the vapor column 420A. Curving the edge surfaces 1005A, 1005B in this manner improves the aerodynamic performance of the vapor column 420A such that when air is forced over the vapor chamber base 415 in the z-direction by the fan 405, the curved edge surface 1005A impedes air flowing in the z-direction less than a straight, or flat, edge surface would. As further shown in FIG. 10A, the edge surfaces 1010A, 1010B of the vapor column 420A that are generally parallel to the z-direction in which air is forced over the vapor chamber base 415 are flattened and/or straight.

FIG. 10B illustrates a top-down view of a cross-section of a vapor column 420B that is generally teardrop-shaped. The base of the vapor column 420B has a teardrop-shape such that a first edge surface 1015 of the vapor column 420B that extends in the x-direction has a convex curvature facing in the direction in which the fan 405 forces air flow over the vapor chamber base 415. The vapor column 420B further includes edge surfaces 1020A, 1020B that extend in the z-direction and join at a vertex 1025. As shown, the length of the teardrop-shaped vapor column 420B is greater than the width of the teardrop-shaped vapor column 420B. When compared to other shapes that can be used to implement a vapor column 420, the teardrop-shape of the vapor column 420B is less resistive to air flow in the z-direction. FIG. 10C illustrates a top-down view of a cross-section of a vapor column 420C that is generally oval-shaped. That is, the base of the vapor column 420C has an oval-shape. As shown, the length of the oval-shaped vapor column 420C is greater than the width of the oval-shaped vapor column 420C.

Persons skilled in the art will understand that the vapor column shapes illustrated in FIGS. 10A-10C are just a few non-limiting examples of shapes that can be used to implement a vapor column 420 included in the 3D vapor chamber 600. Moreover, persons skilled in the art will understand that any feasible shape for which the length of a vapor column 420 is greater the width of the vapor column 420 can be used to implement the vapor columns 420 included in the 3D vapor chamber 600. For example, in some embodiments in which the vapor column 420 has a generally rectangular shape (e.g., vapor column 420A), the edge surfaces 1005A, 1005B of the vapor column 420A are flattened such that the base of the vapor column 420A is a rectangle with straight edges. As another example, in some embodiments, the edge surfaces 1010A, 1010B of the vapor column 420A are curved.

Figure 11:
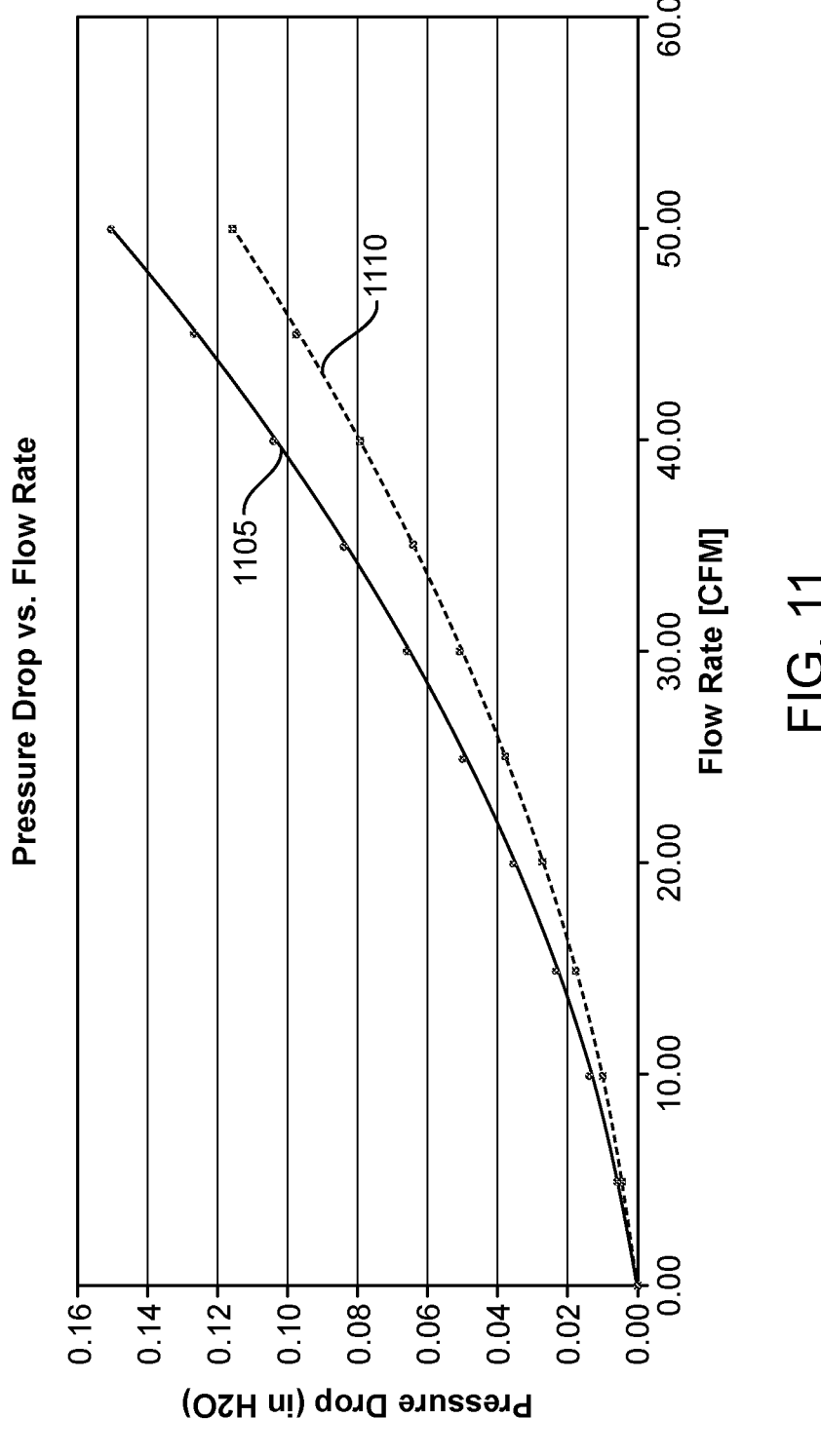
FIG. 11 illustrates exemplar pressure drop versus flow rate curves for different cooling systems, according to various embodiments.

FIG. 11 illustrates a graph 1100 that includes exemplar pressure drop versus flow rate curves for different cooling systems. A first curve 1105 included in the graph 1100 is associated with the performance of a cooling system that includes the prior art 3D vapor chamber 100. In particular, the first curve 1105 indicates the amount by which air pressure drops across the base 105 of the prior art 3D vapor chamber 100 and through the stacked fin assembly 115, which is attached to the prior 3D vapor chamber 100, in the direction in which a fan included in the cooling system forces air over the base 105 and through the stacked fin assembly 115. As described above, the vapor columns 110 included in the prior art 3D vapor chamber 100 have a cylindrical shape in which the width of a vapor column 110 and the length of the vapor column 110 are both equal to the diameter of the vapor column 110. In the illustrated example of FIG. 11, each cylindrical vapor column 110 implemented in the prior art 3D vapor chamber 100 had a diameter of 8 mm when the cooling system was operated to obtain the pressure drop versus flow rate performance indicated by the first curve 1105.

A second curve 1110 included in the graph 1100 is associated with the performance of the cooling system 400 that includes the 3D vapor chamber 600 described herein. In particular, the second curve 1110 indicates the amount by which air pressure drops across the vapor chamber base 415 and the stacked fin assembly 410 in the direction (e.g., z-direction) in which the fan 405 forces air over the vapor chamber base 415 and through the stacked fin assembly 410. As described above, the respective lengths of the vapor columns 420 included in the 3D vapor chamber 600 are greater than the respective widths of the vapor columns 420. In the illustrated example of FIG. 11, each vapor column 420 implemented in the 3D vapor chamber 600 had a generally rectangular shape, such as the shape of vapor column 420A, when the cooling system 400 was operated to obtain the pressure drop versus flow rate performance indicated by the second curve 1110. Moreover, each vapor column 420 implemented in the 3D vapor chamber 600 had a length of 10.66 mm and a width of 4 mm when the cooling system 400 was operated to obtain the pressure drop versus flow rate performance indicated by the second curve 1110. Thus, when compared to the cross-sectional area in the direction of airflow of a cylindrical vapor column 110 having a diameter of 8 mm, the cross-sectional area in the direction of airflow of the 4 mm wide rectangular vapor column 420 is approximately 50% smaller.

As indicated by the first curve 1105, the amount by which air pressure drops across the base 105 of the prior art 3D vapor chamber 100 and the stacked fin assembly 115 increases as the speed of the fan blowing air over the base 105 of the prior art 3D vapor chamber 100 and through the stacked fin assembly 115 is increased. Similarly, as indicated by the second curve 1110, the amount by which air pressure drops across the vapor chamber base 415 and the stacked fin assembly 410 in the z-direction increases as the speed of the fan 405 blowing air over the vapor chamber base 415 and through the stacked fin assembly 410 in the z-direction is increased. However, when the first curve 1105 is compared to the second curve 1110, it becomes apparent that the air pressure drop across the 3D vapor chamber 600, which includes the flattened, generally rectangular-shaped vapor columns 420, and the stacked fin assembly 410 is less than the air pressure drop across the prior art 3D vapor chamber 100, which includes the cylindrical vapor columns 110, and the stacked fin assembly 115. As described above, the amount of air pressure drop across a respective 3D vapor chamber base is inversely proportional to the amount of heat that can be dissipated by a respective cooling system via convection. Therefore, as indicated by first and second curves 1105, 1110, reducing the cross-sectional area of each vapor column 420 in the direction of airflow across the vapor chamber base 415 allows the cooling system 400 to dissipate more heat via convection than a cooling system that includes the prior art 3D vapor chamber 100.

In sum, a cooling system that cools an electronic component, such as a processing unit. The cooling system also includes a stacked fin assembly and a three-dimensional vapor chamber. The three-dimensional vapor chamber includes a base that is thermally coupled to an electronic component and a plurality of vapor columns that extend outward from the base towards the stacked fin assembly. The cooling system further includes a fan arranged to force air in a first direction over the base of the three-dimensional vapor chamber. A first vapor column included in the plurality of vapor columns has a first dimension that is parallel to the first direction in which the fan forces air over the base of the three-dimensional vapor chamber. The first dimension of the first vapor column is also greater than a second dimension of the first vapor column along a second direction that is perpendicular to the first direction in which the fan forces air over the base of the three-dimensional vapor chamber.

At least one technical advantage of the disclosed design relative to the prior art is that, in the disclosed design, the pressure drop across a 3D vapor chamber within a cooling system can be reduced without increasing fan speed, fan size, or the number of fans forcing air through the vapor chamber. In this regard, the vapor columns included in the disclosed design are configured such that the cross-sectional area of each vapor column is reduced in a direction that is perpendicular to airflow across the base of the 3D vapor chamber. By reducing the cross-sectional area of each vapor column in the direction of airflow across the 3D vapor chamber base, the overall impedance generated by the vapor columns and experienced by the air flowing through the 3D vapor chamber is reduced relative to prior art designs. The reduction in impedance results in a reduced pressure drop across the 3D vapor chamber relative to the pressure drops experienced in prior art designs. Thus, with the disclosed design, the amount of heat that can be dissipated by the cooling system can be increased without increasing fan speed, fan size, or the number of fans implemented as part of the cooling system.

1. According to some embodiments, a system comprises an electronic component; a fan arranged to force air in a first direction; a stacked fin assembly; and a three-dimensional vapor chamber that includes a base that is thermally coupled to the electronic component, and a plurality of vapor columns that extend outward from the base towards the stacked fin assembly, wherein a first dimension of a first vapor column that is included in the plurality of vapor columns along the first direction is greater than a second dimension of the first vapor column along a second direction that is perpendicular to the first direction.

2. The system according to clause 1, wherein a first cross-sectional area of the first vapor column is parallel to the first direction and is larger than a second cross-sectional area of the first vapor column that is perpendicular to the first direction.

3. The system according to clause 1 or clause 2, wherein a first surface of the first vapor column that is perpendicular to the first direction has a convex curvature.

4. The system according to any of clauses 1-3, wherein the first vapor column comprises a rectangular prism.

5. The system according to any of clauses 1-4, wherein a base of the first vapor column has an oval-shape.

6. The system according to any of clauses 1-5, wherein a base of the first vapor column has a teardrop-shape.

7. The system according to any of clauses 1-6, wherein a second vapor column that is included in the plurality of vapor columns is disposed adjacent to the first vapor column, and air forced in the first direction by the fan flows through a passage defined between the first vapor column and the second vapor column.

8. The system according to any of clauses 1-7, wherein a hydraulic diameter of the passage is inversely proportional to the second dimension of the first vapor column.

9. The system according to any of clauses 1-8, wherein the fan forces air in the first direction over the base of the three-dimensional vapor chamber.

10. According to some embodiments, a heat sink assembly comprising a stacked fin assembly; and a three-dimensional vapor chamber that includes a base that includes a bottom surface and a top surface, a plurality of vapor columns that extend outward from the top surface of the base towards the stacked fin assembly, wherein a first cross-sectional area of a first vapor column of the plurality of the vapor columns is greater than a second cross-sectional area of the first vapor column, and a vapor space defined within the base and the plurality of vapor columns.

11. The heat sink assembly according to clause 10, wherein the first cross-sectional area is perpendicular to the second cross-sectional area.

12. The heat sink assembly according to clause 10 or clause 11, wherein a second vapor column that is included in the plurality of vapor columns is disposed adjacent to the first vapor column; and wherein a passage is defined between the first vapor column and the second vapor column.

13. The heat sink assembly according to any of clauses 10-12, wherein a hydraulic diameter of the passage is inversely proportional to the second cross-sectional area of the first vapor column.

14. The heat sink assembly according to any of clauses 10-13, wherein a hydraulic diameter of the passage is greater than a dimension of the first vapor column.

15. The heat sink assembly according to any of clauses 10-14, wherein the dimension of the first vapor column is perpendicular to the first cross-sectional area.

16. The heat sink assembly according to any of clauses 10-15, wherein a base of the first vapor column has a teardrop-shape.

17. According to some embodiments, a three-dimensional vapor chamber comprising a base that includes a bottom surface and a top surface; a plurality of vapor columns that extend outward from the top surface of the base towards the stacked fin assembly, wherein a first cross-sectional area of a first vapor column of the plurality of the vapor columns is greater than a second cross-sectional area of the first vapor column; and a vapor space defined within the base and the plurality of vapor columns.

18. The three-dimensional vapor chamber according to clause 17, wherein the first cross-sectional area is perpendicular to the second cross-sectional area.

19. The three-dimensional vapor chamber according to clause 17 or clause 18, wherein a first surface of the first vapor column has a convex curvature and a second surface of the first vapor column is flat.

20. The three-dimensional vapor chamber according to any of clauses 17-19, wherein the first surface of the first vapor column extends in a first direction and the second surface of the first vapor column extends in a second direction that is perpendicular to the first direction.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

While the preceding is directed to embodiments of the present disclosure, other and further embodiments of the disclosure may be devised without departing from the basic scope thereof, and the scope thereof is determined by the claims that follow.

What is claimed is:

1. A system, comprising:

an electronic component;

a fan arranged to force air in a first direction;

a stacked fin assembly; and a three-dimensional vapor chamber that includes:

a base that is thermally coupled to the electronic component; and a plurality of vapor columns that extend outward from the base towards the stacked fin assembly, wherein a first cross-sectional area of a first vapor column that is included in the plurality of vapor columns along the first direction is greater than a second cross-sectional area of the first vapor column along a second direction that is perpendicular to the first direction, and wherein a base of the first vapor column has a first teardrop-shape, and an inner vapor chamber within the first vapor column has a second teardrop-shape.

2. The system of claim 1, wherein a first surface of the first vapor column that is perpendicular to the first direction has a convex curvature.

3. The system of claim 1, wherein a second vapor column comprises a rectangular prism.

4. The system of claim 1, wherein a base of a second vapor column has an oval-shape.

5. The system of claim 1, wherein a second vapor column that is included in the plurality of vapor columns is disposed adjacent to the first vapor column, and air forced in the first direction by the fan flows through a passage defined between the first vapor column and the second vapor column.

6. The system of claim 5, wherein a hydraulic diameter of the passage is inversely proportional to the second cross-sectional area of the first vapor column.

7. The system of claim 1, wherein the fan forces air in the first direction over the base of the three-dimensional vapor chamber.

8. A heat sink assembly, comprising:
a stacked fin assembly; and
a three-dimensional vapor chamber that includes:
  a base that includes a bottom surface and a top surface;
  a plurality of vapor columns that extend outward from the top surface of the base towards the stacked fin assembly, wherein a first cross-sectional area of a first vapor column of the plurality of vapor columns is greater than a second cross-sectional area of the first vapor column, and wherein a base of the first vapor column has a first teardrop-shape, and an inner vapor chamber within the first vapor column has a second teardrop-shape; and
  a vapor space defined within the base and the plurality of vapor columns, wherein the vapor space includes the inner vapor chamber.

9. The heat sink assembly of claim 8, wherein the first cross-sectional area is perpendicular to the second cross-sectional area.

10. The heat sink assembly of claim 8, wherein a second vapor column that is included in the plurality of vapor columns is disposed adjacent to the first vapor column; and
  wherein a passage is defined between the first vapor column and the second vapor column.

11. The heat sink assembly of claim 10, wherein a hydraulic diameter of the passage is inversely proportional to the second cross-sectional area of the first vapor column.

12. The heat sink assembly of claim 10, wherein a hydraulic diameter of the passage is greater than a dimension of the first vapor column.

13. The heat sink assembly of claim 12, wherein the dimension of the first vapor column is perpendicular to the first cross-sectional area.

14. A three-dimensional vapor chamber, comprising:
a base that includes a bottom surface and a top surface;
a plurality of vapor columns that extend outward from the top surface of the base towards a stacked fin assembly, wherein a first cross-sectional area of a first vapor column of the plurality of vapor columns is greater than a second cross-sectional area of the first vapor column, and wherein a base of the first vapor column has a first teardrop-shape, and an inner vapor chamber within the first vapor column has a second teardrop-shape; and
a vapor space defined within the base and the plurality of vapor columns, wherein the vapor space includes the inner vapor chamber.

15. The three-dimensional vapor chamber of claim 14, wherein the first cross-sectional area is perpendicular to the second cross-sectional area.

16. The three-dimensional vapor chamber of claim 14, wherein a first surface of a second vapor column has a convex curvature and a second surface of the second vapor column is flat.

17. The three-dimensional vapor chamber of claim 16, wherein the first surface of the second vapor column extends in a first direction and the second surface of the second vapor column extends in a second direction that is perpendicular to the first direction.

\* \* \* \* \*